US012578404B2

(12) United States Patent
Jia et al.

(10) Patent No.: US 12,578,404 B2
(45) Date of Patent: Mar. 17, 2026

(54) HYBRID CT-MRI SYSTEM

(71) Applicant: Rensselaer Polytechnic Institute, Troy, NY (US)

(72) Inventors: Xun Jia, Dallas, TX (US); Ge Wang, Loudonville, NY (US); Mengzhou Li, Troy, NY (US); Weiwen Wu, Troy, NY (US); Wenxiang Cong, Albany, NY (US); Yuting Peng, Dallas, TX (US); Jace Grandinetti, Dallas, TX (US)

(73) Assignee: Rensselaer Polytechnic Institute, Troy, NY (US)

( * ) Notice: Subject to any disclaimer, the term of this patent is extended or adjusted under 35 U.S.C. 154(b) by 200 days.

(21) Appl. No.: 18/228,064

(22) Filed: Jul. 31, 2023

(65) Prior Publication Data

US 2024/0036135 A1 Feb. 1, 2024

Related U.S. Application Data

(60) Provisional application No. 63/528,937, filed on Jul. 26, 2023, provisional application No. 63/393,315, filed on Jul. 29, 2022.

(51) Int. Cl.
*G01R 33/38* (2006.01)
*G01R 33/385* (2006.01)
*G01R 33/48* (2006.01)

(52) U.S. Cl.
CPC ....... *G01R 33/4812* (2013.01); *G01R 33/385* (2013.01)

(58) Field of Classification Search
CPC .. G01R 33/00; G01R 33/385; G01R 33/4812; G01R 33/0035; G01R 33/0023;
(Continued)

(56) References Cited

U.S. PATENT DOCUMENTS

| | | | |
|---|---|---|---|
| 6,925,319 B2 | 8/2005 | McKinnon | |
| 10,242,443 B2 | 3/2019 | Hsieh et al. | |

(Continued)

FOREIGN PATENT DOCUMENTS

WO 2016206743 A1 12/2016

OTHER PUBLICATIONS

Wang et al "Towards Omni-Tomography-Grand Fusion of Multiple Modalities for Simultaneous Interior Tomography" PLoS ONE 7(6): e39700. doi:10.1371/journal.pone.0039700.
(Continued)

*Primary Examiner* — Lee E Rodak
*Assistant Examiner* — Taqi R Nasir
(74) *Attorney, Agent, or Firm* — Barclay Damon LLP; Anthony P. Gangemi

(57) ABSTRACT

In one embodiment, there is provided a magnetic resonance (MR) subsystem for magnetic resonance imaging (MRI). The MR subsystem includes a first magnet-coil assembly and a second magnet-coil assembly. The first magnet-coil assembly includes a first magnet structure and a first gradient coil. The second magnet-coil assembly includes a second magnet structure and a second gradient coil. The first magnet-coil assembly and the second magnet-coil assembly are separated by a gap. The gap is configured to facilitate transmission of an x-ray beam from an x-ray source to an x-ray detector. The x-ray source and the x-ray detector are included in a computed tomography (CT) subsystem.

20 Claims, 6 Drawing Sheets

(58) Field of Classification Search
CPC ............ G01R 33/0017; G01R 31/3191; G01R 33/0358; G01R 33/0356; G01B 7/004; G01C 17/38; G06F 3/017; G06F 3/0346; G06F 3/012; H01L 39/223
See application file for complete search history.

(56) References Cited

U.S. PATENT DOCUMENTS

| | | | |
|---|---|---|---|
| 10,359,481 B2 | 7/2019 | Wald et al. | |
| 10,438,354 B2 | 10/2019 | Hsieh et al. | |
| 10,475,214 B2 | 11/2019 | Fu et al. | |
| 10,628,973 B2 | 4/2020 | De Man et al. | |
| 10,719,961 B2 | 7/2020 | Jin et al. | |
| 10,925,568 B2 | 2/2021 | Lu et al. | |
| 10,970,887 B2 | 4/2021 | Wang et al. | |
| 10,984,902 B2 | 4/2021 | Laaksonen et al. | |
| 2005/0135560 A1 | 6/2005 | Dafni et al. | |
| 2011/0196228 A1 | 8/2011 | Cho et al. | |
| 2014/0155732 A1 | 6/2014 | Patz et al. | |
| 2018/0040406 A1* | 2/2018 | Rapoport | G01R 33/3873 |
| 2018/0197317 A1 | 7/2018 | Cheng et al. | |
| 2018/0249979 A1* | 9/2018 | Wang | A61B 5/055 |
| 2018/0325477 A1* | 11/2018 | Wang | A61B 6/032 |
| 2019/0104940 A1 | 4/2019 | Zhou et al. | |
| 2019/0278436 A1 | 9/2019 | Gulaka et al. | |
| 2020/0043204 A1 | 2/2020 | Fu et al. | |

OTHER PUBLICATIONS

Wang et al "Vision 20/20: Simultaneous CT-MRI—Next chapter of multimodality imaging" Published Sep. 17, 2015.

* cited by examiner

300

400

500

HYBRID CT-MRI SYSTEM

CROSS REFERENCE TO RELATED APPLICATION(S)

This application claims the benefit of U.S. Provisional Application No. 63/393,315, filed Jul. 29, 2022, and U.S. Provisional Application No. 63/528,937, filed Jul. 26, 2023, which are incorporated by reference as if disclosed herein in their entireties.

GOVERNMENT LICENSE RIGHTS

This invention was made with government support under award number CA237267, awarded by the National Institutes of Health (NIH). The government has certain rights in the invention.

FIELD

The present disclosure relates to a hybrid system, in particular to, a CT (computed tomography)-MRI (magnetic resonance imaging) system.

BACKGROUND

Multimodality medical imaging may be useful in a number of clinical scenarios. Each imaging modality produces information in a defined scope, as characterized by spatial/temporal resolution, signal-to-noise ratio, structural, functional and molecular features, etc. Although these defined scopes may overlap, no single modality can provide all the information another modality offers. It may be appreciated that modern medicine often calls for comprehensive evaluation of a subject from a variety of aspects with different imaging modalities. While it is possible to acquire images of different modalities on separate scanners, thereby achieving multi-modal imaging via post-scan image fusion, this approach has associated challenges including, but not limited to, image registration and associated registration uncertainty, extended scan times, time moving patients between scanners and dynamic changes in patients, particularly in contrast-enhanced studies and/or critical care conditions where synchrony and efficiency of imaging procedures is vital.

SUMMARY

In some embodiments, there is provided a magnetic resonance (MR) subsystem for magnetic resonance imaging (MRI). The MR subsystem includes a first magnet-coil assembly and a second magnet-coil assembly. The first magnet-coil assembly includes a first magnet structure and a first gradient coil. The second magnet-coil assembly includes a second magnet structure and a second gradient coil. The first magnet-coil assembly and the second magnet-coil assembly are separated by a gap. The gap is configured to facilitate transmission of an x-ray beam from an x-ray source to an x-ray detector. The x-ray source and the x-ray detector are included in a computed tomography (CT) subsystem.

In some embodiments of the MR subsystem, the first magnet structure and the second magnet structure are configured to produce an inhomogeneous magnetic field with an ultra-low-field (ULF) magnetic flux density.

In some embodiments of the MR subsystem, a size of the first magnet structure differs from a size of the second magnet structure.

In some embodiments of the MR subsystem, each magnet structure has a cylindrical shape.

In some embodiments of the MR subsystem, each magnet structure includes a respective plurality of magnets arranged in a respective Halbach array.

In some embodiments of the MR subsystem, a number of magnets in the first magnet structure differs from a number of magnets in the second magnet structure.

In some embodiments of the MR subsystem, the magnets are permanent magnets.

In some embodiments of the MR subsystem, each of the magnets includes a neodymium alloy.

In some embodiments of the MR subsystem, each gradient coil is configured as a set of self-shielded gradient coils.

In some embodiments of the MR subsystem, the gradient coils are configured to generate a linearly varying field within a target field of view.

In some embodiments, there is provided a hybrid computed tomography (CT)-magnetic resonance imaging (MRI) system. The CT-MRI system includes a CT subsystem and a magnetic resonance (MR) subsystem. The CT subsystem includes an x-ray source and an x-ray detector positioned on a rotatable support. The MR subsystem includes a first magnet-coil assembly and a second magnet-coil assembly. The first magnet-coil assembly includes a first magnet structure and a first gradient coil. The second magnet-coil assembly includes a second magnet structure and a second gradient coil. The first magnet-coil assembly and the second magnet-coil assembly are separated by a gap. The gap is configured to facilitate transmission of an x-ray beam from the x-ray source to the x-ray detector.

In some embodiments of the CT-MRI system, the first magnet structure and the second magnet structure are configured to produce an inhomogeneous magnetic field with an ultra-low-field (ULF) magnetic flux density.

In some embodiments of the CT-MRI system, a size of the first magnet structure differs from a size of the second magnet structure.

In some embodiments of the CT-MRI system, each magnet structure has a cylindrical shape.

In some embodiments of the CT-MRI system, each magnet structure includes a respective plurality of magnets arranged in a respective Halbach array.

In some embodiments of the CT-MRI system, a number of magnets in the first magnet structure differs from a number of magnets in the second magnet structure.

In some embodiments of the CT-MRI system, wherein the magnets are permanent magnets.

In some embodiments of the CT-MRI system, each of the magnets includes a neodymium alloy.

In some embodiments of the CT-MRI system, the x-ray source and the x-ray detector are configured for cone beam scanning.

In some embodiments of the CT-MRI system, the rotatable support is configured to couple to the first magnet structure via a coupling that allows the rotatable support to rotate while the first magnet structure remains stationary.

BRIEF DESCRIPTION OF THE DRAWINGS

The drawings show embodiments of the disclosed subject matter for the purpose of illustrating features and advantages of the disclosed subject matter. However, it should be understood that the present application is not limited to the precise arrangements and instrumentalities shown in the drawings, wherein.

DETAILED DESCRIPTION

Figure 1A:
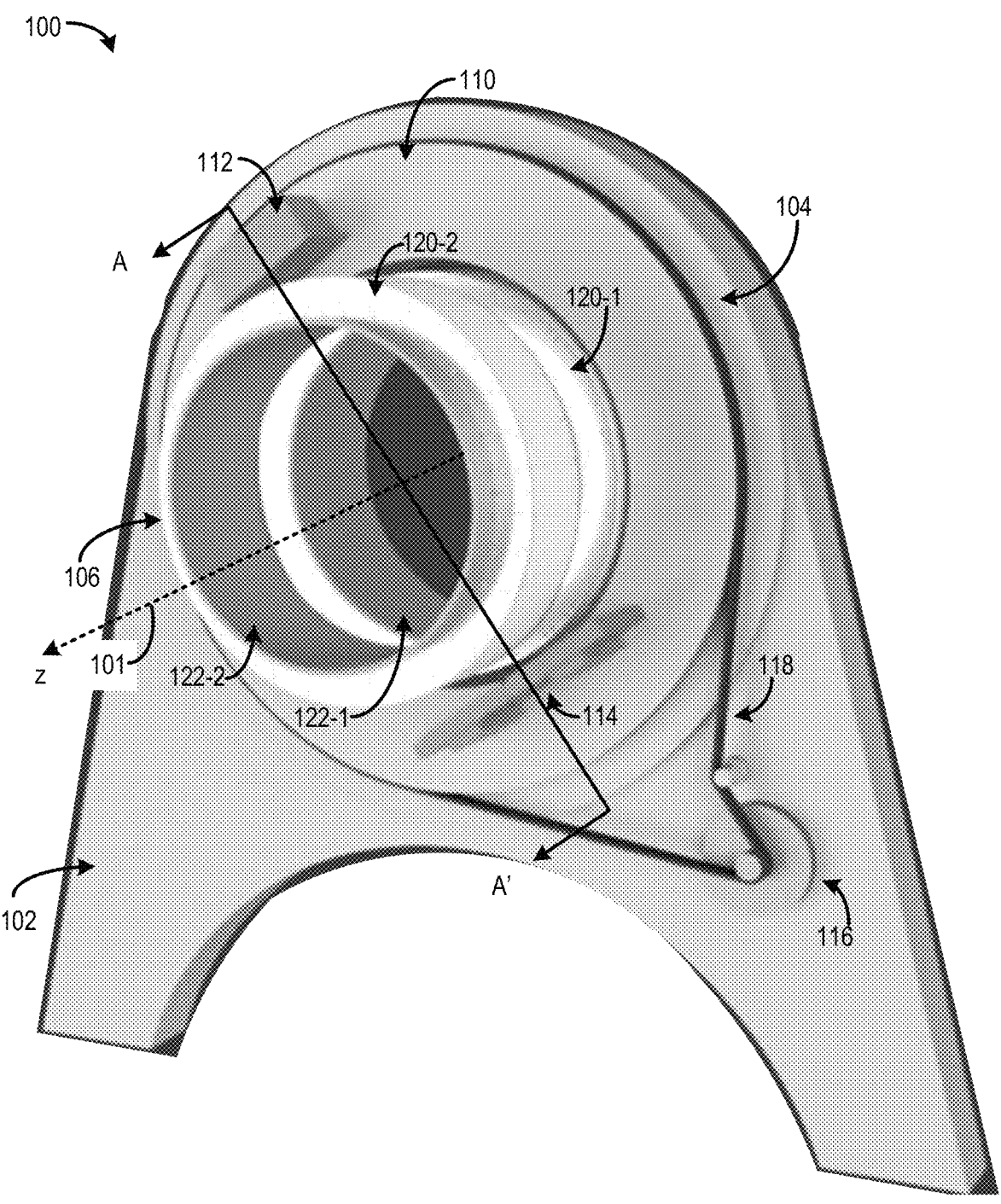
FIG. 1A is a sketch illustrating a hybrid CT-MRI system, according to an embodiment of the present disclosure.

Several types of hybrid scanners have been developed for simultaneous multi-modal imaging. For example, positron emission tomography-computed tomography (PET-CT) hybrid scanners may facilitate cancer diagnosis, staging, and treatment response assessment. In another example, PET-MRI (magnetic resonance imaging) scanners allow characterization of metabolic activities (provided by PET system) enhanced by MRI that may provide structural information in rich soft tissue contrast without ionizing radiation. In these situations, imaging data from different modalities acquired at a same time, facilitates joint image reconstruction and processing, enhancing image quality and thus performance of associated clinical tasks.

A CT-MRI hybrid scanner may enhance cardiac diagnosis and contrast-enhanced cancer imaging. It may be appreciated that conventional MRI scanners are configured to generate a relatively high strength (e.g., magnetic flux density in the range of 1-3 T (tesla)) homogeneous (on the order of a few parts per million) magnetic field to achieve a relatively high signal to noise ratio (SNR) and an imaging performance within a clinically acceptable scan time. It may be appreciated that the magnetic field is susceptible to perturbations from nearby ferromagnetic materials and the imaging performance may be affected by an x-ray tube and detector assembly, when integrated with a CT scanner. A relatively weak MR (magnetic resonance) signal may be sensitive to radio frequency (RF) signals generated by nearby devices that may affect SNR and degrade MR images. Additionally or alternatively, a fringe magnetic field over the x-ray tube and detector assembly from the MRI system can degrade their functionality due to deflection of the electron beam and malperformance of electronics in the magnetic field. Integrating relatively bulky MR and CT components into a relatively compact space may provide physical/mechanical challenges to a hybrid CT-MRI system design.

Generally, this disclosure relates to a hybrid CT-MRI system, that may be portable. In an embodiment, a CT-MRI system, according to the present disclosure, may include a CT subsystem and an MR subsystem. The MR subsystem is configured to produce an inhomogeneous magnetic field with an ultra-low-field (ULF) magnetic flux density. An inhomogeneous field design, according to the present disclosure, is configured to facilitate integration with a CT subsystem, and in a form factor that may facilitate portability. As used herein, "ultra-low-field (ULF)" corresponds to a magnetic flux density (i.e., magnetic field strength) of on the order of tens of milli-tesla (mT). Advantageously, the relatively low magnetic field strength and inhomogeneous field are configured to provide the MRI system relatively more robustness to perturbations from the CT components, and a corresponding low-fringe magnetic field is configured to facilitate integration with the CT subsystem. It may be appreciated that a ULF MR subsystem may have a lesser cost and is configured to facilitate integration with the CT subsystem. It may be appreciated that an MR subsystem configured to produce an inhomogeneous magnetic field with ULF magnetic flux density has a relatively smaller signal to noise ratio (SNR). It is contemplated that a machine (e.g., deep) learning technique may be included in a hybrid CT-MRI system, according to the present disclosure, configured to mitigate effects of the relatively smaller SNR.

In an embodiment, the MR subsystem may include a plurality (e.g., two) of magnet structures, each having a cylindrical shape with a respective radius, generally aligned along a longitudinal axis and separated by a gap in the longitudinal direction. In one embodiment, each magnet structure may correspond to a permanent magnet. In one nonlimiting example, each magnet structure may correspond to neodymium (i.e., alloy of neodymium, iron, and boron (NdFeB)) ring of about 40.0 cm (centimeters) radius. In this example, the corresponding MR subsystem may be configured to form a magnetic field of about 57 mT at an isocenter. The neodymium rings may have equal or unequal radii. The two neodymium rings may be separated by a gap of about 11.3 cm to accommodate a rotating CT support. In this example, a targeted MR imaging field of view (FOV) may be a sphere of approximately 15 cm in diameter. In one nonlimiting example, a CT subsystem may be configured with a field of view diameter of approximately 20 cm in an axial direction and about 5 cm in a longitudinal direction.

In one embodiment, there is provided a magnetic resonance (MR) subsystem for magnetic resonance imaging (MRI). The MR subsystem includes a first magnet-coil assembly and a second magnet-coil assembly. The first magnet-coil assembly includes a first magnet structure and a first gradient coil. The second magnet-coil assembly includes a second magnet structure and a second gradient coil. The first magnet-coil assembly and the second magnet-coil assembly are separated by a gap. The gap is configured to facilitate transmission of an x-ray beam from an x-ray source to an x-ray detector. The x-ray source and the x-ray detector are included in a computed tomography (CT) subsystem.

In an embodiment, there is provided a hybrid computed tomography (CT)-magnetic resonance imaging (MRI) system. The CT-MRI system includes a CT subsystem and a magnetic resonance (MR) subsystem. The CT subsystem includes an x-ray source and an x-ray detector positioned on a rotatable support. The MR subsystem includes a first magnet-coil assembly and a second magnet-coil assembly. The first magnet-coil assembly includes a first magnet structure and a first gradient coil. The second magnet-coil assembly includes a second magnet structure and a second gradient coil. The first magnet-coil assembly and the second magnet-coil assembly are separated by a gap. The gap is configured to facilitate transmission of an x-ray beam from the x-ray source to the x-ray detector.

FIG. 1A is a sketch illustrating a hybrid CT-MRI system 100, according to an embodiment of the present disclosure. System 100 includes a portion of an enclosure, e.g., housing portion 102, a CT subsystem 104, and an MR subsystem 106. The CT subsystem 104 and the MR subsystem 106 may each have a center axis coincident with a longitudinal axis 101 of system 100. The longitudinal axis 101 corresponds to a z-axis in an xyz coordinate system.

The housing portion 102 is configured to house and to provide a mounting structure for the CT subsystem 104 and the MR subsystem 106. It should be noted that another portion of the enclosure that includes housing portion 102 is not shown, in order to more clearly illustrate the CT subsystem 104 and the MR subsystem 106. The portion of the enclosure not shown may be configured to enclose the CT subsystem 104, and to enclose and provide additional mounting structure for the MR subsystem 106.

The hybrid CT-MRI system 100 may further include a solenoid transmit/receive RF coil. The hybrid CT-MRI system 100 may further include a data acquisition pipeline. It may be appreciated that standard MRI techniques can be used with a spectrometer for sequence control, RF and gradient amplifiers for signal amplification. Processing of the acquired data may include accommodation for a relatively low SNR related to the low field strength and signal loss caused by dephasing in the presence of the inhomogeneous field. For example, a machine learning technique may be implemented, configured to enhance image generation from acquired data. However, this disclosure is not limited in this regard.

The CT subsystem 104 includes a rotatable support 110, an x-ray source 112, and a detector 114. The rotatable support 110 may have a generally cylindrical (e.g., ring) shape, with a center axis of the rotatable support 110 generally coincident with the longitudinal axis 101. In one nonlimiting example, the x-ray source 112 may correspond to an x-ray tube. In one nonlimiting example, the x-ray detector 114 may correspond to a flat panel x-ray detector. The x-ray source 112 and the detector 114 are mounted on the rotatable support 110. In one nonlimiting example, the rotatable support 110 may correspond to a slip ring. However, this disclosure is not limited in this regard. The slip ring may provide continuous data communication with the rotor, as well as power delivery to the x-ray source (e.g., x-ray tube) 112 and x-ray detector (e.g., flat panel) 114. In one nonlimiting example, the slip ring may correspond to a drum type slip ring with an inner diameter of 950 mm and may have a maximum rotation speed of 120 rpm.

The MR subsystem 106 includes a first magnet structure 120-1, a second magnet structure 120-2, a first gradient coil 122-1, and a second gradient coil 122-2. The magnet structures and the gradient coils are generally cylindrically shaped, with a center axis of each cylinder generally coincident with longitudinal axis 101. The first gradient coil 122-1 is positioned at least partially within the first magnet structure 120-1, with an outer curved surface of the first gradient coil 122-1 adjacent to an inner curved surface of the first magnet structure 120-1. Similarly, the second gradient coil 122-2 is positioned at least partially within the second magnet structure 120-2, with an outer curved surface of the second gradient coil 122-2 adjacent to an inner curved surface of the second magnet structure 120-2.

The rotatable support 110 may have a generally cylindrical shape, as described herein. An inner surface of the rotatable support 110 may be coupled to the outer curved surface of the first magnet structure. The coupling between the rotatable support 110 and the first magnet structure 120-1 is configured to allow the rotatable support 110 to rotate while the first magnet structure 120-1 remains stationary. The first magnet structure 120-1 is configured to be positioned relative to the second magnet structure 120-2 with a gap between the structures, as will be described in more detail below. The x-ray source 112 and detector 114 are positioned relative to the magnet structures to generally align with the gap, during rotation of the rotatable support 110.

In operation, the rotatable support 110 may be rotated by a motor 116 coupled to the rotatable support by, for example, a belt 118. Rotation of the rotatable support 110 is configured to rotate the x-ray source 112 and the detector 114. The x-ray source 112 and detector 114 may thus be mounted on a same surface of the rotatable support 110, positioned generally along a diameter of the support 110, opposing each other such that alignment of the source 112 and detector 114 is maintained during rotation of the rotatable support 110.

Figure 1B:
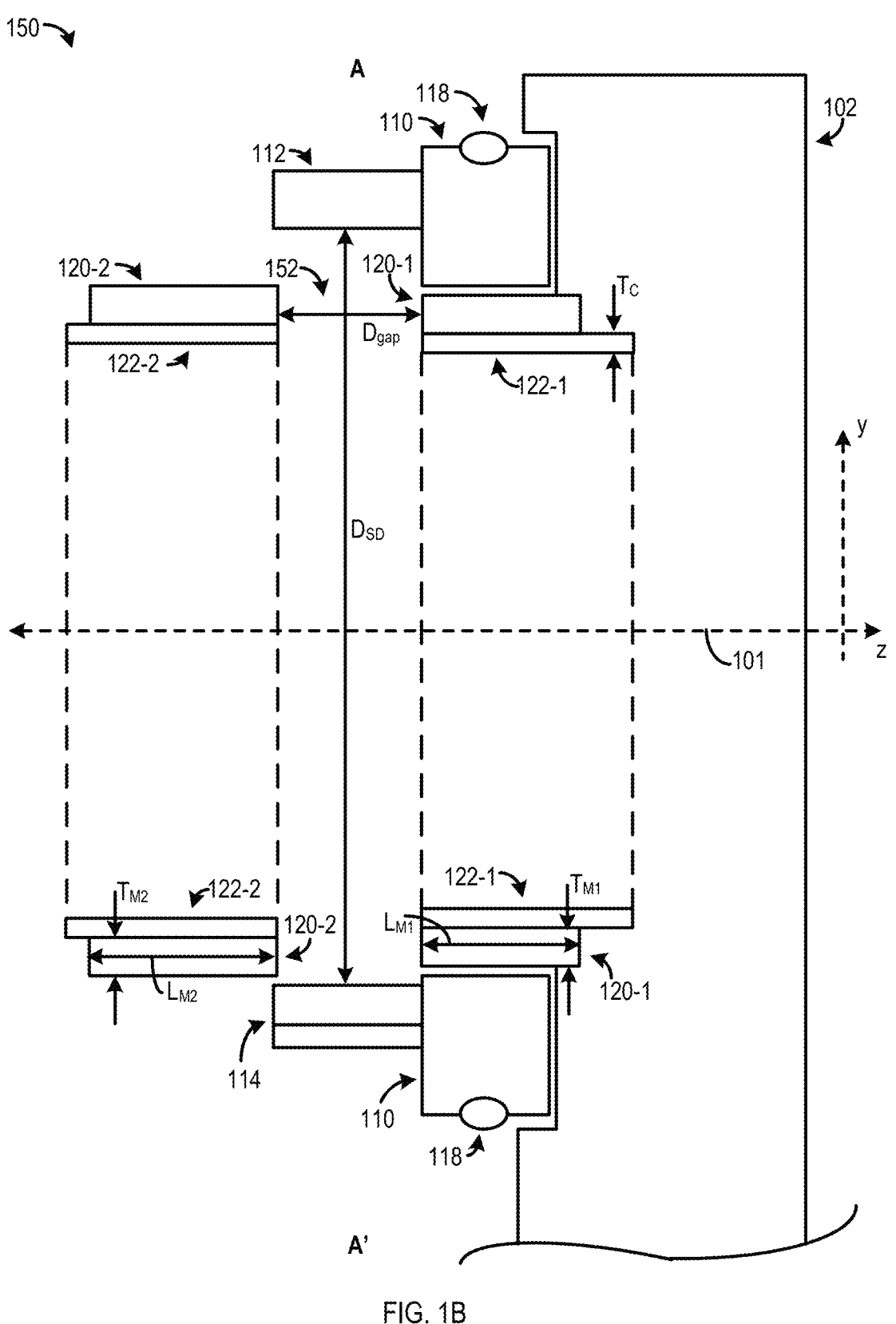
FIG. 1B is a cross-section A-A' view of a portion of the hybrid CT-MRI system of FIG. 1A.

FIG. 1B is a cross-section A-A' view 150 of a portion of the hybrid CT-MRI system of FIG. 1A. The cross-section A-A' view 150 is configured to illustrate relative positions of the MR subsystem 106 and the CT subsystem 104. The cross-section view includes the longitudinal axis, z, that corresponds to the center line of the cylindrically shaped magnet structures 120-1, 120-2, gradient coils 122-1, 122-2, and the rotatable support 110. The cross-section view further includes a y-axis, perpendicular to the y-axis and oriented vertically in the FIG. 1B. An x-axis may be defined, perpendicular to both the z-axis and the y-axis, i.e., into the page, in the orientation of FIG. 1B.

The magnet structures 120-1, 120-2 may each have a respective magnet structure thickness, $T_{M1}$, $T_{M2}$, (in the y-direction) and a respective magnet length (in the longitudinal direction, parallel to the z-axis), $L_{M1}$, $L_{M2}$. In some embodiments, the magnet structure thicknesses may be the same. In some embodiments, the magnet structure thicknesses may not be the same. In some embodiments, the magnet structure lengths may not be the same. The gradient coils 122-1, 122-2 may each have a coil thickness Tc (in the y-direction). The first magnet structure 120-1 and the first gradient coil 122-1 are separated from the second magnet structure 120-2 and the second gradient coil 122-2 by a gap 152 having a length (in the longitudinal direction, parallel to the z-axis), $D_{gap}$. The gap is configured to allow an x-ray beam from x-ray source 112 to pass through a field of view to the detector 114, without being blocked by the MR subsystem 106 elements. In one nonlimiting example, the gap 152 length may be approximately 11.33 cm, to facilitate passage of the x-ray beam of the CT subsystem 104. The source 112 and detector 114 may be separated by a distance, $D_{SD}$ (in the y-direction).

Thus, during operation of the corresponding hybrid CT-MRI system, alignment of the x-ray source 112 and x-ray detector 114 may be maintained with gap 152, as the rotatable support 110 rotates.

Figure 2:
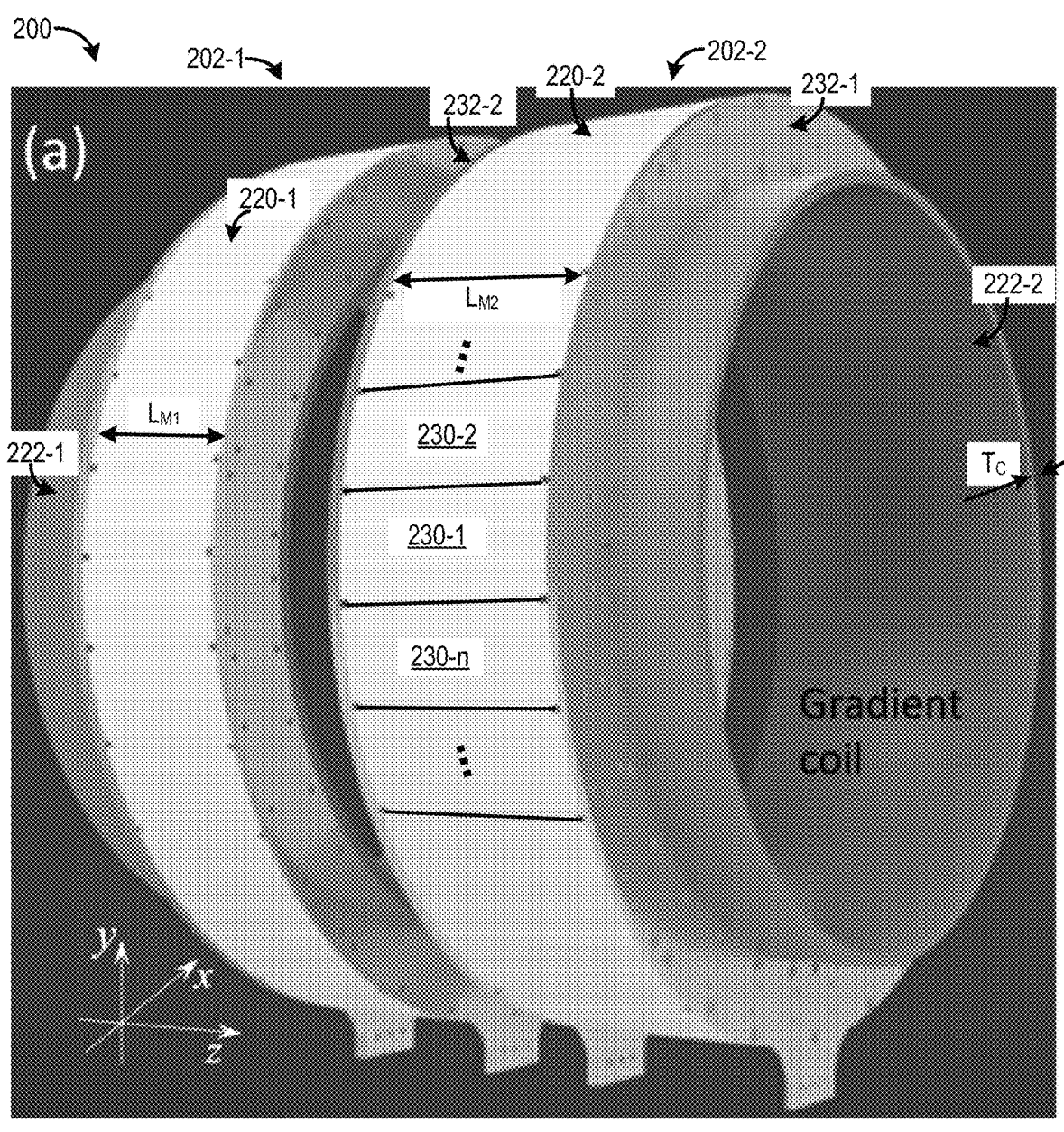
FIG. 2 is a sketch illustrating an MR subsystem, according to an embodiment of the present disclosure.

FIG. 2 is a sketch illustrating an MR subsystem 200, according to an embodiment of the present disclosure. MR subsystem 200 corresponds to MR subsystem 106 of FIGS. 1A and 1B. MR subsystem 200 includes a first magnet-coil assembly 202-1, and a second magnet-coil assembly 202-2. The first magnet-coil assembly 202-1 includes a first magnet structure 220-1 and a first gradient coil 222-1, and the second magnet-coil assembly 202-2 includes a second magnet structure 220-2 and a second gradient coil 222-2. In an embodiment, a size (e.g., length and/or radius) of the first magnet structure 220-1 differs from a size of the second magnet structure 220-2. Each magnet structure, e.g., the second magnet structure 202-2, includes a plurality of magnets 230-1, 230-2, . . . , 230-n positioned about a circumference of the magnet structure. The magnet structure 202-2 further includes a first end plate 232-1, and an opposing (in the longitudinal direction) second end plate 232-2. The plurality of magnets 230-1, 230-2, . . . , 230-n are sandwiched between the end plates 232-1, 232-2. The end plates may further include features to facilitate mounting the magnet-coil assemblies into an enclosure, e.g., housing 102 of FIG. 1A.

In an embodiment, the magnet structures 202-1, 202-2 may be formed of a plurality of individual magnets. The plurality of individual magnets may be arranged in a Halbach array, configured to provide a magnetic field with generally uniform field lines oriented generally parallel to the y-direction over at least the field of view, when the magnet structures are oriented as shown in FIGS. 1A and 1B. A Halbach array may be configured to create relatively uniform magnetic fields using magnet bars. It may be appreciated that design of a Halbach array for target magnetic flux density may include adjusting a number of magnets for each magnet structure, a respective radius of each magnet structure, and a separation between magnet structures. A material composition, a grade (related to magnetic field strength), a number and a respective size of the individual magnets in each magnet structure may be selected based, at least in part, on target field of view, target magnetic field strength, target minimum signal to noise ratio, etc.

In one nonlimiting example, each magnet structure 202-1, 202-2 includes a ring of neodymium (NdFeB) permanent magnets. Both magnet structures 202-1, 202-2 are configured to orient the permanent magnets in the Halbach format to form a magnetic field uniformly in the y-direction. In one nonlimiting example, the first magnet structure 202-1 may include 34 bar magnets of grade N52 with dimensions of each bar $5.08 \times 5.08 \times 15.24$ cm$^3$ (i.e., $L_{M1}$=15.24 cm) aligned along a circumference of a circle of radius 40.6 cm, and the second magnet structure 202-2 may include 32 bar magnets of $5.08 \times 5.08 \times 20.32$ cm$^3$ (i.e., $L_{M2}$=20.32 cm) along a circumference of a circle of 40.0 cm radius. Thus, in this example, the magnet structures including the magnets, their sizes, relative positions and orientations are configured to provide a magnetic field of about 57 mT at an isocenter.

Figure 3:
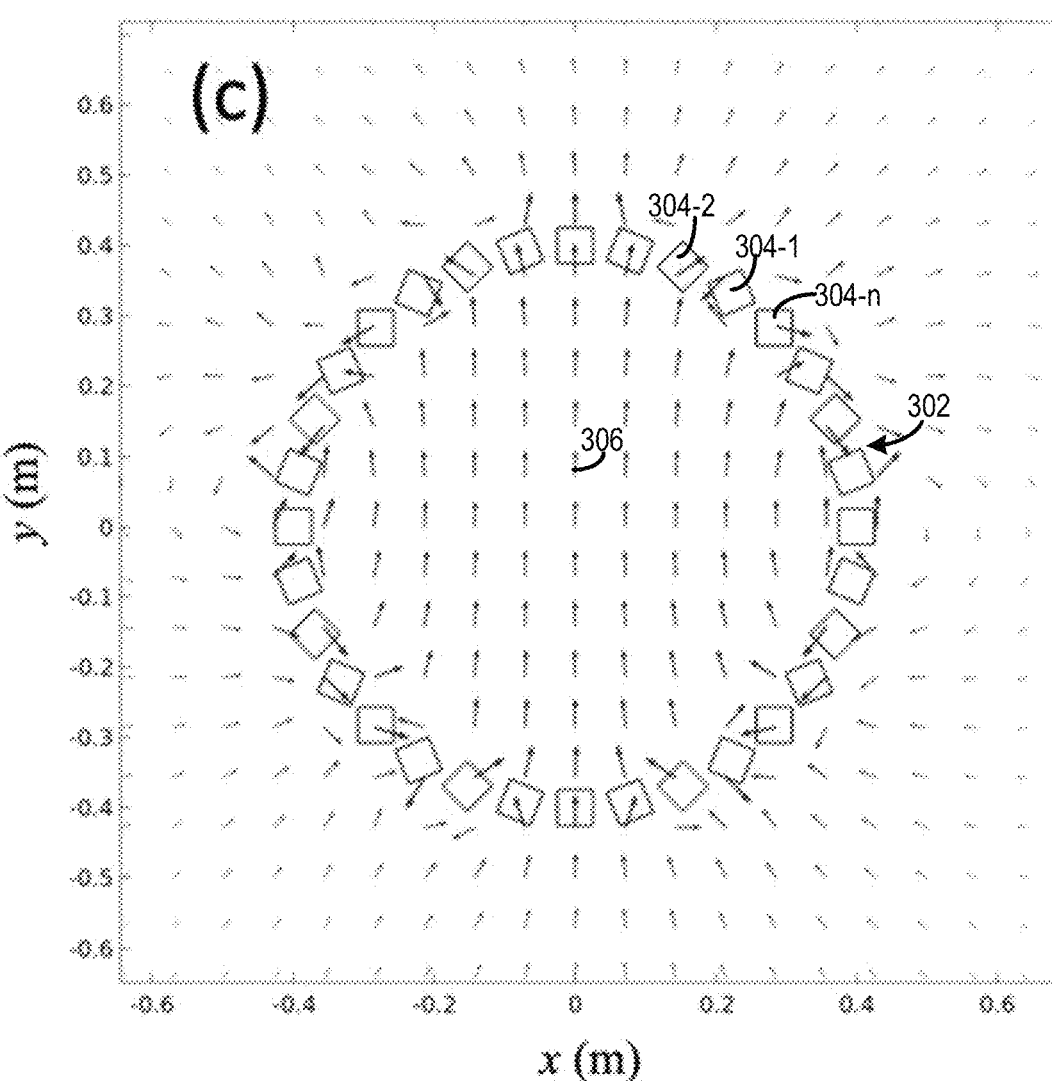
FIG. 3 is a plot illustrating one example Halbach array and corresponding magnetic flux density distribution on a $z=0$ plane.

FIG. 3 is a plot 300 illustrating one example Halbach array 302 and corresponding magnetic flux density distribution on a $z$=0 plane. The Halbach array 302 includes a plurality of bar magnets 304-1, 304-2, . . . , 304-$n$. In the plot, a horizontal axis corresponds to the x-axis, a vertical axis corresponds to the y-axis, and units are in meters (m). Orientation of the magnets in the xy-plane is configured provide a target magnetic flux density, as indicated by magnetic field lines (e.g., magnetic field line 306) in the plot.

In the example MR subsystem, configured as MR subsystem 200, described herein, the magnetic field is slightly stronger towards the second magnet structure 202-1, i.e., the smaller radius magnet structure. Unequal Halbach array sizes are configured to provide a field gradient that may then be utilized for spatial encoding along the longitudinal direction (z axis) and may result in a reduction in a number of gradient coils. In the example MR subsystem, configured as MR subsystem 200, the resulting gradient strength is about 25 mT/m (milli-tesla per meter). It may be appreciated that, to hold the magnet bars 230-1, 230-2, . . . , 230-$n$ in place, given their varying orientation, 3D printing technology can be used to create molds based, at least in part, on the designed positions and orientations of magnet bars. Aluminum plates, e.g., end plates 232-1, 232-2, may be used to secure the molds in place. Continuing with the example MR subsystem, an inner radius of each magnet assembly is 36.8 cm and 36.1 cm, respectively, for the large 202-2 and small magnet assemblies 202-1.

Turning again to FIG. 2, each gradient coil 222-1, 222-2 is configured as a set of self-shielded gradient coils. Each gradient coil 222-1, 222-2 is configured to provide spatial encoding along patient lateral directions (x and y directions). In one nonlimiting example, each gradient coil may include a number, e.g., four, generally cylindrical layers oriented generally parallel to the inner surface of the respective magnet structure. In one nonlimiting example, each gradient coil may have a thickness of 2.5 cm (thickness $T_C$ in FIG. 1B). In one nonlimiting example, a target field method may be used to determine a coil pattern to generate a linearly varying field within a target field of view (FOV) of 15 cm in diameter. The target field method may be further configured to reduce or minimize a magnetic field at or near adjacent metal parts to avoid an eddy current effect.

Figure 4:
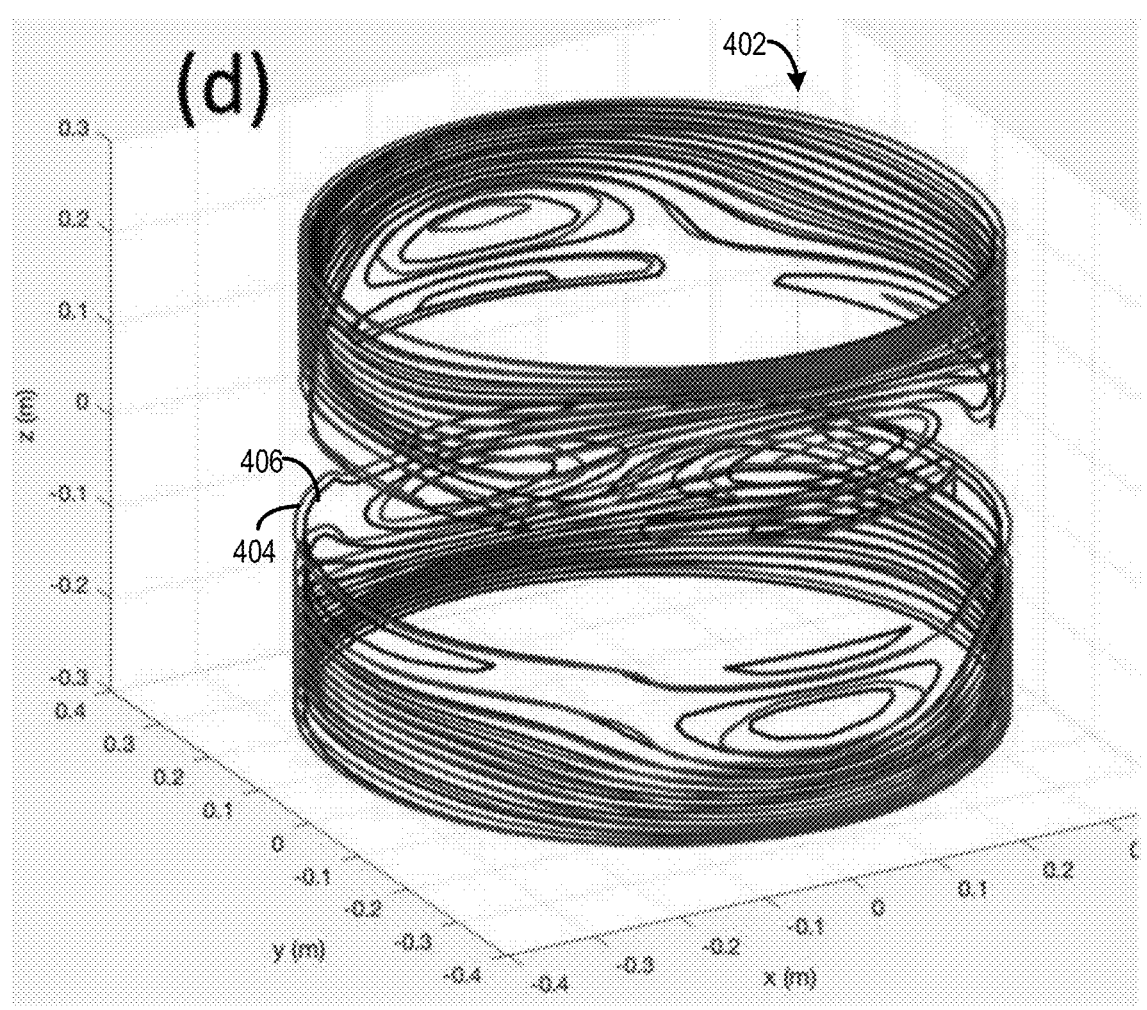
FIG. 4 is a plot of a coil pattern for an example gradient coil structure, according to an embodiment of the present disclosure.

FIG. 4 is a plot 400 of a coil pattern 402 for an example gradient coil structure, according to an embodiment of the present disclosure. The example gradient coil structure includes a first gradient coil and a second gradient coil generally aligned in the longitudinal direction and separated, in the longitudinal direction, by a gap. The example coil structure corresponds to the coil structure of FIGS. 1A, 1B, and 3, as described herein. Plot 400 includes x, y and z axes, all with units of meters. The gap corresponds to gap 152 of FIG. 1B and is configured to at least reduce blocking of the x-ray beam of the CT subsystem, e.g., CT subsystem 110. The coil pattern includes a shielding layer 404, and a primary layer 406.

Figure 5:
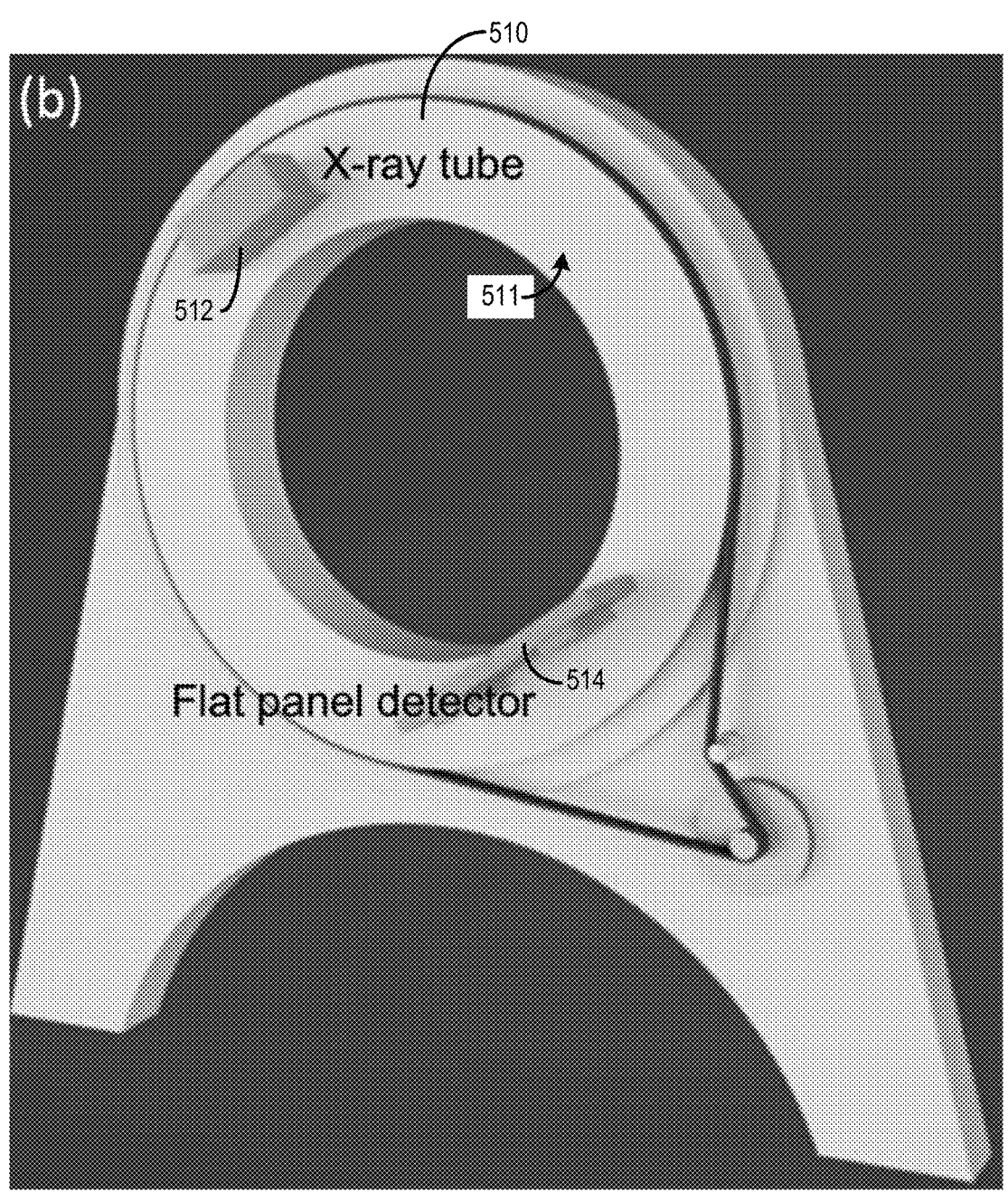
FIG. 5 is a sketch illustrating a CT subsystem, according to an embodiment of the present disclosure.

FIG. 5 is a sketch illustrating a CT subsystem 500, according to an embodiment of the present disclosure. The CT subsystem 500 includes a rotating support 510, an x-ray source 512, and an x-ray detector 514. The source 512 and detector 514 are mounted on a surface 511 of the rotating support 510. In one nonlimiting example, source 512 and detector 514 may be configured for a cone-beam scanning geometry.

In one nonlimiting example, a source-to-detector distance is 1,125 mm, and source-to-isocenter distance 500 mm. It may be appreciated that the source-to-detector distance and source-to-isocenter distance are similar to corresponding distances in a medical CT scanner. The source-to-detector distance and source-to-isocenter distance are configured to avoid geometrical interference with the MR subsystem, e.g., MR subsystem 106. In one nonlimiting example, the x-ray source 512 may be configured as a medical pulse x-ray source with a focal spot of approximately 0.5 mm, a half-cone angle of 18°, a kVp (kilovoltage peak) range between 100 to 400 kVp, and a current range between 1 to 13 mA (milliamperes). The x-ray detector 514 may correspond to a flat panel detector. In one nonlimiting example, the x-ray detector 514 may include a combination of two PaxScan 2520DX flat panel detectors (VAREX Imaging, Salt Lake City, UT) to form a larger detector. Detector 514 may further include amorphous silicon as x-ray sensor material and may include a direct deposit CsI (Caesium-Iodide) conversion screen. The example detector has a pixel pitch of 127 μm (micrometers) and is configured to support a resolution of 1lp/mm (line pair per millimeter) at >48%. The example detector array includes 1536×1920 pixels. The energy detection is configured to be in the range of 40 to 160 keV (kilo-electron volts). The intrinsic frame rate is 12.5/s (second) but can be increased when working in binning modes. The example detector is configured to weigh about 5.5 lbs. In one nonlimiting example, detector 514 may be configured to operate in a 4×4 binning mode. Due to obstruction by the Mill assembly, the x-ray beam produced by x-ray source 512 may be confined to a half cone-beam angle 3° in the longitudinal direction to avoid scattering from the MRI components. In this setting, the effective detector array corresponds to 384×960 pixels with pixel pitch of 508 μm. The CT FOV may then be approximately 20 cm diameter in the axial direction and 5 cm in the longitudinal (i.e., z) direction.

Thus, a CT-MRI system, according to the present disclosure, may include a CT subsystem and an MR subsystem. The MR subsystem is configured to produce an inhomogeneous magnetic field with an ultra-low-field (ULF) magnetic flux density. Advantageously, the relatively low magnetic field strength and inhomogeneous field are configured to provide the MRI system relatively more robustness to perturbations from the CT components, and a corresponding low-fringe magnetic field is configured to facilitate integration with the CT subsystem. The MR subsystem may include a plurality (e.g., two) of magnet structures, each having a cylindrical shape with a respective radius, generally aligned along a longitudinal axis and separated by a gap in the longitudinal direction. In one embodiment, each magnet structure may correspond to a permanent magnet.

One example hybrid CT-MR imaging system, according to the present disclosure, was modeled and tested via simulation. In the simulation, 2D (two-dimensional) spin-echo type sequences were used for MR data acquisition. 2D spin-echo type sequences may facilitate alleviating signal dephasing that may be caused by a main magnetic field inhomogeneity. It may be appreciated that, for each 2D acquisition, an RF wave of frequency f is configured to excite spins around a curved iso-magnetic field surface defined by the condition $f=\gamma B_0(x, y, z)$, where $B_0(x, y, z)$ is the magnetic flux density field, and y is the gyromagnetic ratio. For a given phantom defined by volumetric images of longitudinal relaxation time $T_1(x, y, z)$, transverse relaxation time $T_2(x, y, z)$, and spin density $\rho(x, y, z)$, a spin-echo sequence may be specified with repetition time TR and echo time TE. An integrated signal for a pulse with a slice selection frequency f may then be written as:

$$S(k_x, k_y) = \tag{1}$$

$$\sum_{x,y,z} I_w[|f - \gamma B_0(x, y, z)|]\rho(x, y, z)B_0(x, y, z)^2 \times \left[1 - \exp(-\frac{TR}{T_1(x, y, z)})\right]$$

$$\exp[-\frac{TE}{T_2(x, y, z)}] \times \exp[-TE(\delta\gamma\Delta B_0)]\exp[-i(k_x x + k_y y)],$$

where $I_w[\cdot]$ is an index function with $I_w[x]=1$ if $|x|<w/2$ and 0 otherwise. w is the bandwidth of the RF pulse. The term $\exp[-TE(\delta\gamma\Delta B_0)]$ corresponds to a dephasing effect due to the magnetic field gradient, and $\delta$ is a constant obtained by calibrating this model using a known MR scanner.

Noise may not be neglected in an ULF MRI scan due to a relatively weak signal related to the low magnetic field, and the field inhomogeneity induced dephasing effect. Additionally or alternatively, the presence of free electrons in RF coil or hardware vibrations in practice may contribute to the noise. In the simulation, Gaussian white noise with standard deviation $\sigma=C_0\sqrt{B_0}/\sqrt{T_{ACQ}}$ was added to $S(k_x, k_y)$. $C_0$ is a calibration constant obtained empirically on an existing MRI scanner, and $T_{ACQ}$ is the total acquisition time. The noise may be signal independent.

After collecting k space data, a 2D image m(x, y) was reconstructed using a Fourier-transform based reconstruction algorithm. To suppress image noise, the images may be denoised using BM3D (Block-matching and 3D filtering) algorithm. As is known, BM3D is a 3-D block-matching algorithm that may be used for noise reduction in images.

After collecting images for a series of RF frequencies, 2D images defined on a set of curved iso-surfaces of magnetic flux density may be obtained, each characterized by $f=\gamma B_0$ (x, y, z). To generate a volumetric image, the 2D images were sampled to a Cartesian grid according to the known positions of the iso-surfaces.

To simulate the CT imaging process, in one nonlimiting example, a circular scan mode with 720 projection views per rotation was evaluated. To simulate x-ray projections, a monochromatic radiation model was utilized, and the detected signal may then be expressed as:

$$p=f_{Poisson}[N_0 \exp(-P\mu(x,y,z))], \tag{2}$$

where P corresponds to the CT projection system matrix, $\mu(x, y, z)$ is the volumetric image of the x-ray attenuation coefficient, $f_{Poisson}[\cdot]$ corresponds to a Poisson process, p corresponds to the recorded projections in a vector form, and $N_0$ corresponds to an incoming number of photons. In the simulation, the incoming number of photons was set to $3\times10^6$.

With the simulated x-ray data, an image may be reconstructed using the standard Feldkamp-Davis-Kress (FDK) algorithm. Since the CT FOV is relatively small compared to the whole human body, with a combination of a plurality, e.g., two, detectors, the CT system may be subject to lateral truncation of projections. An iterative method for interior tomography may be used to improve reconstruction results. For example, a simultaneous algebraic reconstruction technique with a total variation (SART-TV) regularization may be configured to solve the optimization problem:

$$\operatorname{argmin}_\mu \|P\mu(x,y,z)+\log(p/N_0)\|^2+\lambda\|\nabla\mu(x,y,z)\|_1, \tag{3}$$

where $\lambda$ is a parameter balancing the data fidelity term and the sparsity constraint. In one nonlimiting example, the ASTRA toolbox may be used during the forward projection and volumetric reconstruction.

Numerical simulations were performed using two phantoms to demonstrate performance of a CT-MR scanner system, according the present disclosure. A first phantom corresponds to a 3D Shepp-Logan phantom. It may be appreciated that this 3D Shepp-Logan phantom is configured to represent typical brain tissues including scalp, bone, cerebrospinal fluid (CSF), gray and white matters, and example tumor. For CT simulation, the attenuation values were chosen in reference to an original specification of the 2D Shepp-Logan phantom. As the Shepp-Logan phantom defines relative density values to water in the interval [1.0, 2.0], x-ray attenuation based on the density values were assigned. In one nonlimiting example, for MR simulation, associated parameters of proton density $\rho$, relaxation times T1 and T2 may be set according to H. M. Gach, C. Tanase, and F. Boada, "2D & 3D Shepp-Logan phantom standards for MRI", in Proc. 19th Int. Conf. Syst. Eng., August 2008, pp. 521-526, the full disclosure of which is included herein by reference, in its entirety.

In another simulation example, a phantom generated from the publicly-available, anatomically detailed, 3D CT and MRI database from the Visible Human Project (VHP) of the National Library of Medicine was used. It may be appreciated that the anatomically detailed phantom of the VHP may be clinically more relevant. Male patient images were used in the simulation. However, this disclosure is not limited in this regard. X-ray attenuation coefficients may be derived from the CT images. It may be appreciated that the VHP database is configured to provide proton density-weighted, T1-weighted and T2-weighted MR images. Thus, for the MRI simulation, the proton density image, longitudinal and transverse relaxation times were derived by, for example, solving signal equations associated with the MR sequences.

The simulation results included, among other things, a magnetic flux density distribution generated by the main magnet. For a targeted spherical imaging field of view (FOV) of 15 cm in diameter, the flux density strength was in the range of 55 to 68 mT. The magnetic flux density generally decayed monotonically along the z direction, creating a gradient of about 25 mT/m in the FOV. It may be appreciated that the gradient may facilitate spatial encoding along the z (i.e., longitudinal) direction without a gradient coil.

The simulation results further included plots of a plurality of iso-surfaces of various magnetic field strengths. These surfaces may be utilized for planning for data acquisition and image reconstruction by performing 2D scans on these surfaces. A separation between neighboring surfaces is approximately 0.4 cm. It may be appreciated that these surfaces may not be planar, thus, image domain interpolation may be used to generate a volumetric image defined on a Cartesian grid.

The magnetic flux density strength decreased to approximately 20 mT outside the magnet at a radius of 50 cm from iso-center, for simulated positions of the x-ray tube, and approximately 3 mT at the CT detector position with a radium of 62.5 cm from the iso-center. It is contemplated that the relatively low magnetic field may be configured to not interfere with the normal functions of these CT components.

Simulation results for the Shepp-Logan phantom were analyzed. In one nonlimiting example, for the MR simulation, the relaxation time TR and TE were 1,000 ms and 80 ms, respectively. The slice thickness was 4 mm, and the voxel size on the axial planes was $1\times1$ mm$^2$. To reduce noise, data acquisition was repeated, with the number of excitations (NEX) set to 16. The simulation results were plotted, illustrating proton density of the phantom in three orthogonal views configured to show the structure of the phantom. The simulation results further included the resulting MR image. The CT simulation results of the Shepp-Logan phantom were plotted. The image voxel size was 0.5 mm$^3$. Due to the narrow x-ray beam through the gap (i.e., gap 152 of FIG. 1B) between the two magnet rings, the longitudinal coverage of the CT scan was 5 cm.

Simulation results further included an axial view of the phantom in CT and MR images with different reconstruction and processing methods. It may be appreciated that for CT, in a lateral direction, the corresponding relatively limited FOV included truncation artifacts in the conventional FDK reconstruction result, including the bright distorted parts in the image and the cupping effect in the vertical profile. The phantom includes three small structures close to the FOV boundary. Additionally or alternatively, the three small structures close to the FOV boundary were barely discernable compared to the background. It is contemplated that the challenge associated with discerning these structures is likely due to a low contrast between the tumor and the gray matter. It may be appreciated that an interior tomography technique, for example, as demonstrated in the SART-TV result ($\lambda$=0.0003), may at least partially address these discernibility challenges. The simulation results illustrated tumors with 10 HU (Hounsfield units) contrast from the background. It may be appreciated that the tumors were evident, in part, due to the noise suppression capability of the technique. It may be further appreciated that cupping and truncation artifacts were removed from the reconstruction, and the profiles aligned relatively well with the ground truth counterparts.

As for the MR images, the image reconstructed by Fourier algorithm had a large amount of noise due to the low magnetic field strength and field inhomogeneity-induced signal dephasing. Using the BM3D algorithm effectively suppressed image noises.

Simulation results configured to demonstrate image resolution performance included phantom bar patterns embedded along the three major directions, with the bar width ranging from 0.5 mm to 5 mm. It may be appreciated that, although the contrast reduces for small bars, the smallest bar at width 0.5 mm was observable.

To illustrate the performance of the example hybrid CT-MRI system with relatively more clinical relevance, simulation results included results for different body sites using the VHP data. In the brain case, for example, a relatively low resolution along superior-inferior direction in the MR image may be caused by the phantom itself. In the VHP MR image dataset, the slides spacing is 3 mm, which limited the image resolution in the simulation results.

Simulation results further included results from the neck and chest sites. Simulation results included simulation results of the CT and MR images, as well as a blended view by displaying CT and MRI images in different squares. It is contemplated that the capability of integrated CT-MRI imaging in the same spatial coordinate system may offer advantages in a variety of clinical tasks, such as disease diagnosis and therapy planning.

Generally, this disclosure relates to an integrated, i.e., hybrid, CT-MRI system An MR subsystem, according to the present disclosure, is configured to provide an ultra-low inhomogeneous main magnetic field and the CT subsystem is configured to be relatively slim. Advantageously, the ULF MR subsystem and relatively slim CT subsystem facilitate system integration and compatibility between CT and MR components. Reducing the strength of the main magnetic field is configured to reduce electromagnetic interference that may be present at or near CT components, e.g., x-ray source tube and x-ray detector flat panels. It may be appreciated that additional shielding may be added to further reduce the field strength. For example, it is straightforward to use shielding materials, such as mu metals, to isolate the CT and MR subsystems bi-directionally.

Additionally or alternatively, employing an inhomogeneous field design may provide increased tolerability to uncertainties in the system engineering, as compared to a traditional homogeneous field design. Realizing a homogeneous field usually relies on relatively complex approaches, such as active and passive shimming, to achieve the targeted homogeneity level of a few parts per million. With the inhomogeneous field, a specific level of homogeneity is not required, and the imaging and reconstruction process may be performed with the magnetic field distribution as prior information. It is contemplated that this conceptual change in magnetic field homogeneity may reduce corresponding engineering challenges in design of the magnetic field distribution. It may be appreciated that, even if an actual achieved magnetic field deviates from a corresponding design magnetic field, if the deviation is relatively small, e.g., satisfying the condition of monotonicity along the z-axis, the field may remain usable for MRI.

As described herein, the magnetic main field varying along the z-axis may provide the spatial encoding field along this direction, thus eliminating one of the three spatial gradient coils in classical MR scanners. This helps reduce the complexity of the system integration within a compact space, lowering the system cost and simplifying the system maintenance.

Additionally or alternatively, an MR subsystem, according to the present disclosure, may define a relatively large bore size, e.g., bore size diameter of approximately 67 to 68 cm at the inferior and the superior sides. It may be appreciated that this relatively larger bore size is larger than common MR scanners. It may be appreciated that the relatively large bore allows flexible patient positioning, e.g., in positioning a target region of interest in the imaging FOV, and may further benefit patients suffering from claustrophobia. It may be appreciated that a relatively smaller bore size may help increase field strength, that may then improve the SNR. However, it is contemplated that, for an MR subsystem, according to the present disclosure, a slight increase in magnetic field strength corresponding to a reduced bore diameter may not significantly translate to a significant SNR improvement.

A hybrid CT-MRI system, according to the present disclosure, is configured to be a relatively low-cost solution. In one nonlimiting example, the first and second magnet structures together may include more than 200 NdFeB cubic magnets arranged in two generally cylindrical rings separated by the gap to accommodate a CT subsystem. Including aluminum endplates and other supporting structures, the estimated cost of the magnet structures was approximately $20 k (twenty thousand dollars). Continuing with this example, and assuming standard MR gradient coils, standard RF coils, and standard spectrometer for conventional MRI, and a total hardware cost, including CT subsystem may be approximately $100 k, with an overall cost of a complete hybrid CT-MRI system of less than about $250 k. It is contemplated that a relatively lower cost hybrid CT-MRI system, according to the present disclosure may be attractive for underdeveloped countries.

It is contemplated that implementing the magnet structures using, for example, superconducting magnets may increase magnetic field strength, although at an increased cost and possibly complexity of the magnet design related to compatibility with CT. It may be appreciated that a suitable low-strength magnetic field may be generated using conducting coils.

It may be appreciated that ultra-low-field MRI may have a relatively low SNR. Relatively low SNR may degrade image quality and, in some situations, may extend imaging time. It is contemplated that deep learning-based imaging may be utilized to reduce or minimize effects of the relatively low SNR. For example, in the simulation results, as described herein, images were reconstructed using the Fourier transform-based reconstruction method together with a denoising operation. A relatively large number of repetitions were simulated to increase SNR, and the number of repetitions increased data acquisition time. Applying advanced deep reconstruction and processing techniques may improve image quality, e.g., deep learning techniques to mitigate noise and together with super-resolution techniques to maintain image resolution.

It is contemplated that joint CT-MRI reconstruction may improve performance of a hybrid CT-MRI system, consistent with the present disclosure. It may be appreciated that, in a hybrid CT-MRI system, according to the present disclosure, CT and MR images are aligned in the same coordinate system. As a result, CT and MR images may share a number of similar features including, for example, edges, thus, synergizing CT and MRI reconstruction. It is further contemplated that a joint reconstruction approach may provide benefits compared to conventional image domain regularization. For example, a unified model may be trained to learn a joint distribution of CT and MR images. The unified model may then provide a significant amount of prior information that may then be used to guide the reconstruction process and improve the resultant image quality.

It may be appreciated that the inhomogeneous magnetic field produced by an MR subsystem, as described herein, may result in intra-voxel dephasing and corresponding signal loss. It may be further appreciated that spin-echo MR sequences may be used to refocus dephased spins during data acquisition. Spin-echo MR sequences may increase data acquisition time compared to gradient-based sequences. Some sequences, such as turbo spin echo, may accelerate data acquisition. It is contemplated that advanced image reconstruction and processing techniques configured to optimize the image quality may mitigate effects of signal loss, and the relatively low SNR.

Generally, this disclosure relates to a portable CT-MRI system. In an embodiment, according to the present disclosure, a CT-MRI system includes an MR subsystem that includes two magnet structures, each magnet structure corresponding to a respective ring of NdFeB magnets. In one nonlimiting example, each magnet structure has a radius of about 40.0 cm. In some embodiments, the magnet structures may have unequal radii. In some embodiments, the magnet structures may have equal radii. The magnetic subsystem is configured to produce a magnetic field having a magnetic field strength of about 57 mT at the iso-center. The magnetic subsystem is configured with a gap of 11.33 cm between the magnet structures to accommodate the x-ray beam from the CT subsystem. The targeted MR imaging field of view is a sphere of approximately 15 cm in diameter and that of CT is approximately 20 cm diameter in axial direction and 5 cm in longitudinal direction. Numerical simulations results demonstrated operation of one example hybrid CT-MRI system, according to the present disclosure.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A magnetic resonance (MR) subsystem for magnetic resonance imaging, the MR subsystem comprising:
   a first magnet-coil assembly comprising a first magnet structure and a first gradient coil; and
   a second magnet-coil assembly comprising a second magnet structure and a second gradient coil;
   the first magnet-coil assembly and the second magnet-coil assembly separated by a gap, the gap configured to facilitate transmission of an x-ray beam from an x-ray source to an x-ray detector, the x-ray source and the x-ray detector included in a computed tomography (CT) subsystem disposed within a gap separating the first magnet-coil assembly and the second magnet-coil assembly, the x-ray detector and the x-ray source supported by a rotatable support having a cylindrical shape including an inner surface coupled to an outer curved surface of the first magnet structure enabling the x-ray detector and x-ray source to be rotated while the first magnet structure remains stationary, and wherein the first gradient coil and second gradient coil are positioned at least partially within the first magnet structure and second magnet structure, respectively, with an outer curved surface of the first gradient coil and second gradient coil adjacent to an outer curved surface of the first magnet structure and second magnet structure, respectively.

2. The MR subsystem of claim 1, wherein the first magnet-coil assembly and the second magnet-coil assembly are configured to produce an inhomogeneous magnetic field with an ultra-low-density (ULF) magnetic flux density.

3. The MR subsystem of claim 1, wherein a size of the first magnet structure differs from a size of the second magnet structure.

4. The MR subsystem of claim 1, wherein each magnet structure has a cylindrical shape.

5. The MR subsystem of claim 1, wherein each magnet structure comprises a respective plurality of magnets arranged in a respective Halbach array.

6. The MR subsystem of claim 5, wherein a number of magnets in the first magnet structure differs from a number of magnets in the second magnet structure.

7. The MR subsystem of claim 5, wherein the magnets are permanent magnets.

8. The MR subsystem of claim 5, wherein each of the magnets comprises a neodymium alloy.

9. The MR subsystem of claim 1, wherein each gradient coil is configured as a set of self-shielded gradient coils wherein each gradient coil includes a number of layers, each layer being oriented generally parallel to an inner surface of their respective magnet structure.

10. The MR subsystem of claim 1, wherein the gradient coils are configured to generate a linearly varying field within a target field of view.

11. A hybrid computed tomography (CT) magnetic resonance imaging (MRI) system, the system comprising:
   a CT subsystem comprising an x-ray source, and an x-ray detector positioned on a rotatable support; and
   a magnetic resonance (MR) subsystem comprising a first magnet-coil assembly and a second magnet-coil assembly, the first magnet-coil assembly comprising a first magnet structure and a first gradient coil and the second magnet-coil assembly comprising a second magnet structure and a second gradient coil, the first magnet-coil assembly and the second magnet-coil assembly separated by a gap, the gap configured to facilitate transmission of an x-ray beam from the x-ray source to the x-ray detector, wherein the first gradient coil and second gradient coil are positioned at least partially within the first magnet structure and second magnet structure, respectively, with an outer curved surface of the first gradient coil and second gradient coil adjacent to an outer curved surface of the first magnet structure and second magnet structure, respectively, and wherein the rotatable support comprises a cylindrical shape having an inner surface coupled to an outer curved surface of the first magnet structure, and in which the rotatable support is coupled to the first magnet structure such that the rotatable support rotates the x-ray tube and x-ray detector while the first magnet structure remains stationary.

12. The hybrid CT-MRI system of claim 11, wherein the first magnet structure and the second magnet structure are configured to produce an inhomogeneous magnetic field with an ultra-low-field (ULF) magnetic flux density.

13. The hybrid CT-MRI system of claim 11, wherein a size of the first magnet structure differs from a size of the second magnet structure.

14. The hybrid CT-MRI system of claim 11, wherein each magnet structure has a cylindrical shape.

15. The hybrid CT-MRI system of claim 11, wherein each magnet structure comprises a respective plurality of magnets in a respective Halbach array.

16. The hybrid CT-MRI system of claim 15, wherein a number of magnets in the first magnet structure differs from the number of magnets in the second magnet structure.

17. The hybrid CT-MRI system of claim 15, wherein the magnets are permanent magnets.

18. The hybrid CT-MRI system of claim 15, wherein each of the magnets comprises a neodymium alloy.

19. The hybrid CT-MRI system of claim 11, wherein the x-ray source and the x-ray detector are configured for conebeam scanning.

20. The hybrid CT-MRI system of claim 11, wherein each gradient coil is configured as a set of self-shielded gradient coils in which each gradient coil includes a number of layers, each layer being oriented generally parallel to an inner surface of their respective magnet structure.

* * * * *